(12) United States Patent
Hsu et al.

(10) Patent No.: US 12,332,291 B2
(45) Date of Patent: Jun. 17, 2025

(54) METHOD FOR PROBE PIN RETRIEVAL

(71) Applicant: TAIWAN SEMICONDUCTOR MANUFACTURING COMPANY LTD., Hsinchu (TW)

(72) Inventors: Ming-Cheng Hsu, Hsin-Chu (TW); Wen-Chun Tu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 657 days.

(21) Appl. No.: 17/687,400

(22) Filed: Mar. 4, 2022

(65) Prior Publication Data
US 2023/0034452 A1 Feb. 2, 2023

Related U.S. Application Data

(60) Provisional application No. 63/227,745, filed on Jul. 30, 2021.

(51) Int. Cl.
*G01R 3/00* (2006.01)
*G01R 1/06* (2006.01)
*G01R 1/067* (2006.01)
*G01R 1/073* (2006.01)

(52) U.S. Cl.
CPC .............. *G01R 3/00* (2013.01); *G01R 1/06* (2013.01); *G01R 1/06711* (2013.01); *G01R 1/07314* (2013.01)

(58) Field of Classification Search
CPC ........ G01R 3/00; G01R 1/06; G01R 1/06711; G01R 1/07357; G01R 1/07314; G01R 1/0675
See application file for complete search history.

(56) References Cited

U.S. PATENT DOCUMENTS

| | | | | |
|---|---|---|---|---|
| 4,901,013 A | * | 2/1990 | Benedetto | G01R 1/07357 324/755.06 |
| 6,255,832 B1 | * | 7/2001 | Notohardjono | G01R 1/07357 324/750.25 |
| 7,282,936 B2 | * | 10/2007 | Brandorff | G01R 1/07371 324/750.25 |
| 2009/0096474 A1 | * | 4/2009 | Rogers | G01R 1/0735 324/750.19 |

FOREIGN PATENT DOCUMENTS

| | | | |
|---|---|---|---|
| JP | 2008145224 A | * | 6/2008 |
| KR | 20180088030 A | * | 8/2018 |

* cited by examiner

*Primary Examiner* — Daniel R Miller
(74) *Attorney, Agent, or Firm* — WPAT LAW; Anthony King

(57) ABSTRACT

A method for retrieving a probe pin includes following operations. A probe head is received in a carrier. The probe head includes an upper die, a lower die, and at least a probe pin extending in a direction from the lower die to the upper die. A first bending delta between a probe tip of the probe pin and a pin tip of the probe pin is measured. The probe pin is bended by a bending fixture when the first bending delta is greater than a value to obtain a second bending delta between the pin tip and the pin head. The probe pin is pushed in the direction from the lower die to the upper die by a plate. The probe pin is picked from the probe head by an arm.

20 Claims, 11 Drawing Sheets

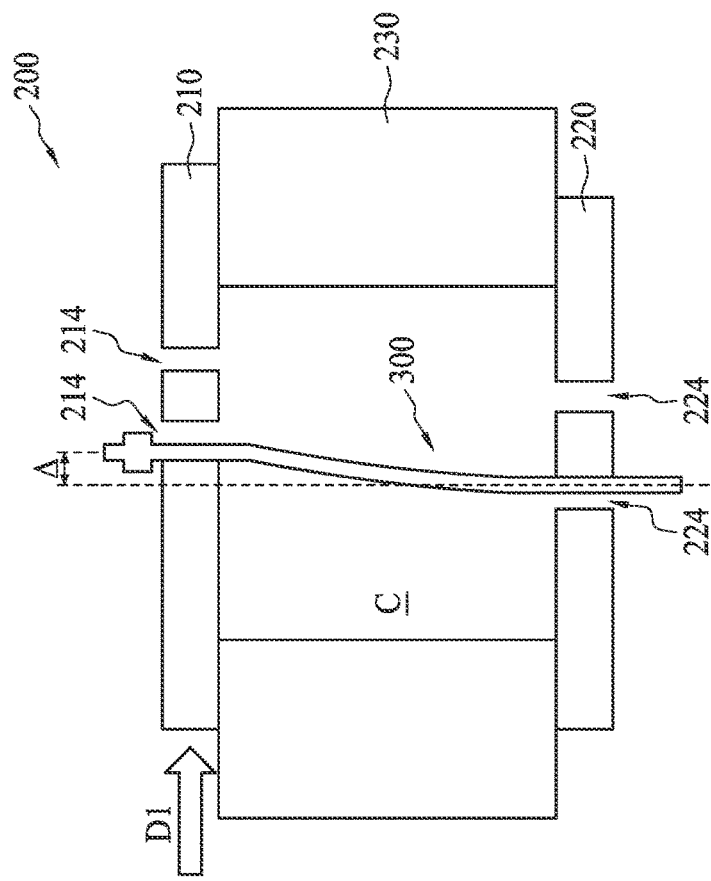
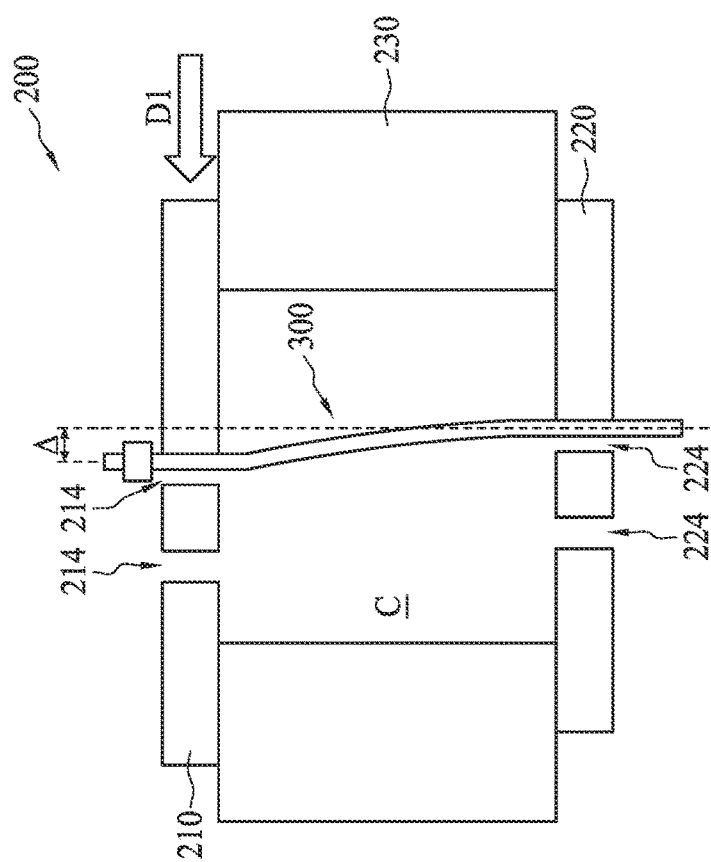
FIG. 4A
FIG. 4B

METHOD FOR PROBE PIN RETRIEVAL

PRIORITY DATA

This patent claims the benefit of U.S. Provisional Patent Application Ser. No. 63/227,745 filed Jul. 30, 2021, the entire disclosure of which is hereby incorporated by reference.

BACKGROUND

During various stages in semiconductor manufacturing, there is a need to verify quality of formed integrated circuits. Testing of the integrated circuits may be performed by using probe cards to probe contact pads of metal bumps on surfaces of the wafers or chips.

As pitches of the contact pads are reduced, corresponding pitches of probe pins in the corresponding probe card need to be reduced accordingly. As a result, a challenge arises in assembly of probe heads that includes such small-pitch probe pins.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A and 4B are schematic drawings illustrating a probe head in different stages according to aspects of the present disclosure in one or more embodiments.

FIGS. 5 to 11 illustrate a method for a probe head pin retrieval at various stages according to aspects of the present disclosure in one or more embodiments, wherein FIG. 10 is a schematic drawing illustrating a probe pin retrieved from the probe head.

DETAILED DESCRIPTION

Figure 1:
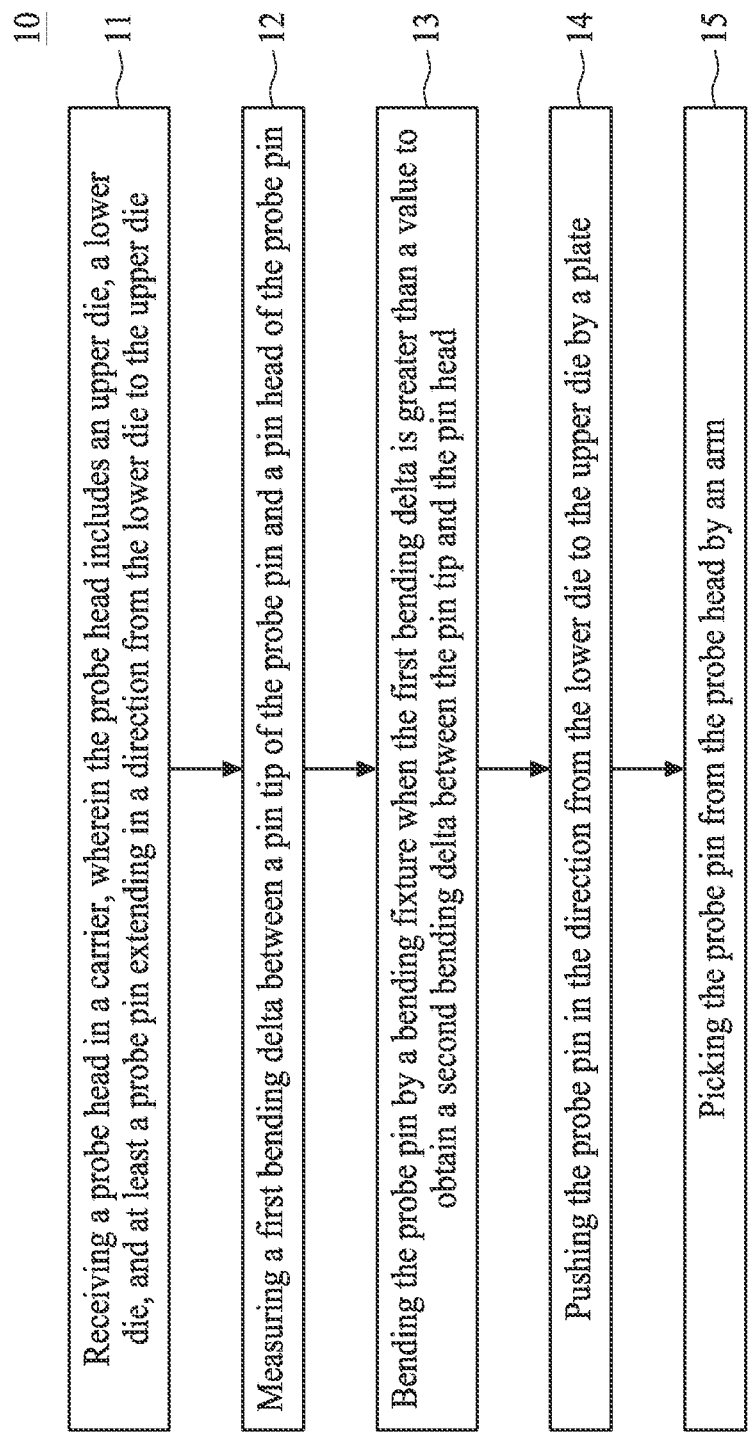
FIG. 1 shows a flowchart representing a method for a probe pin retrieval according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A large number of probe cards are used for device testing. Such probe cards may not be used again at the end of their service life. However, probe pins, from the probe cards may be recycled and re-used. Therefore, a method for retrieving and re-assembling the probe pins are required.

In some embodiments, a probe card is configured to test functionality of devices-under-test (DUTs). In some embodiments, the DUTs may be semiconductor devices, chips, or dies with contact pads on a wafer. In some embodiments, a probe card may include at least a circuit board (not shown), a space transformer (not shown), a probe head 200 and at least a probe pin 300. In some embodiments, the circuit board may be a printed circuit board (PCB) having certain testing circuits. In some embodiments, the circuit board electrically connects the DUTs to an automatic testing equipment (ATE) for testing. The space transformer is disposed between the circuit board and the probe head 200 to electrically connect the probe head 200 to the circuit board.

Figure 2:
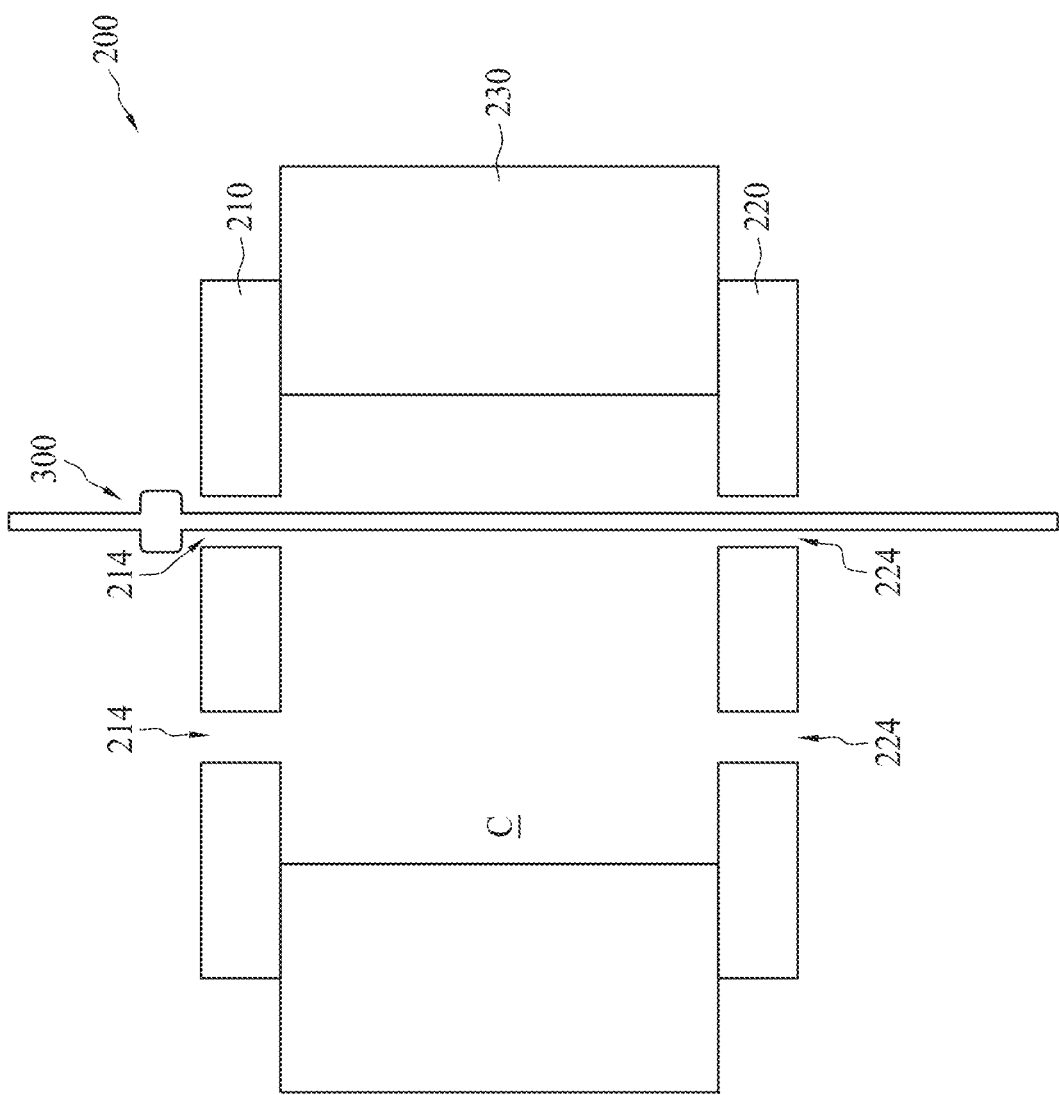
FIG. 2 is a schematic drawing illustrating a probe head according to aspects of the present disclosure in one or more embodiments.

Please refer to FIG. 2, which is a schematic drawing illustrating a probe head 200 of a probe card. The probe head 200 may include at least an upper die 210 (also referred to as an upper guide plate), at least a lower die 220 (also referred to as a lower guide plate), and a spacer 230 between the upper die 210 and the lower die 220. In some embodiments, a quantity of the upper dies 210 may be modified according to different requirements. For example, the probe head 200 may include a first upper die, and a second upper die between the first upper die and the spacer 230, but the disclosure is not limited thereto. In such embodiments, a connection element may be disposed between the first upper die and the second upper die to secure the two upper dies, but the disclosure is not limited thereto. In some embodiments, a quantity of the lower dies 220 may be modified according to different requirements. For example, the probe head 200 may include a first lower die, and a second lower die between the first lower die and the spacer 230, but the disclosure is not limited thereto. In such embodiments, a connection element may be disposed between the first lower die and the second lower die to secure the two lower dies, but the disclosure is not limited thereto. The connection elements include, for example but not limited thereto, pins, clamps, or the like.

The upper and lower dies 210 and 220 are configured to constrain the probe pin 300. In some embodiments, the upper die 210 and the lower die 220 may be formed of a dielectric material such as ceramic, vespel, engineering plastic, or the like, but the disclosure is not limited thereto. In some embodiments, the upper die 210 and the lower die 220 may include silicon, silicon nitride, and quartz, but the disclosure is not limited thereto. An example range of thickness for each of the upper die 210 and the lower die 220 may be between approximately 250 micrometers and approximately 675 micrometers, but the disclosure is not limited thereto. The term "thickness" as related to the upper and lower dies 210 and 220 indicates a vertical dimension in the context of FIG. 2. In some embodiments, the thickness of each of the upper die 210 and the lower die 220 may be approximately 500 micrometers, but the disclosure is not limited thereto.

The spacer 230 is disposed between the upper die 210 and the lower die 220. The spacer 230, the upper die 210, and the lower die 220 together define a cavity C. A probe pin 300 is disposed in the cavity C and extends from the lower die 220 toward the upper die 210. It should be noted that the spacer 230 can be plural. In such embodiments, there may be two separate spacers 230 inserted from opposite directions toward the space between the lower die 220 and the upper die 210. In other embodiments, there may be three or four spacers 230. The spacers 230 may be formed of a dielectric material, although they may also be formed of conductive materials. For example, in some embodiments, the spacers 230 may include metals, such as steel, or other rigid materials that have good flatness and provide stability for the upper and lower dies 210 and 220. After the spacers 230 are inserted into desirable positions, the relative positions of the upper die 210, the lower die 220, and the spacers 230 may be secured, for example, by using pins, clamps, or the like.

The probe head 200 is thus assembled. An example range of a thickness for the spacer 230 may be between approximately 3 millimeters and approximately 5 millimeters. For example, the thickness of the spacer 230 is approximately 4 millimeters, but the disclosure is not limited thereto.

The upper die 210, the lower die 220 and the spacer 230 may have a variety of shapes and dimensions, depending on a required design. For example, the upper die 210, the lower die 220 and the spacer 230 may be rectangular or circular in shape, or may have irregular shapes.

Still referring to FIG. 2, in some embodiments, the upper die 210 has at least a through hole 214 (also referred to as an aperture) allowing the probe pin 300 to pass through. Similarly, the lower die 220 has at least a through hole 224 allowing the probe pin 300 to pass through. It should be noted that the through hole 214 of the upper die 210, the through hole 224 of the lower die 220, and the probe pin 300 can be plural, as shown in FIG. 2. In some embodiments, the through holes 214 of the upper die 210 and the through holes 224 of the lower die 220 are vertically aligned with a one-to-one correspondence.

The through holes 214 and 224 may be rectangular or circular in shape but may be varied in accordance with some other embodiments of the present disclosure. An example range of widths of the through holes 214 and 224 may be between approximately 50 micrometers and approximately 70 micrometers, where the term "width" as related to the through holes 214 and 224 indicates a horizontal dimension in the context of FIG. 2. The widths of the through holes 214 may be substantially equal to each other, and the widths of the through holes 224 may be substantially equal to each other, but the disclosure is not limited thereto. In some embodiments, the widths of the through holes 214 and the widths of the through holes 224 are substantially equal to each other, but the disclosure is not limited thereto.

The through holes 214 and 224 are arranged according to a patterns of contact pads of a DUT (not shown) with a one-to-one correspondence, so that the probe head 200 may be used to probe the DUT. In some embodiments, the through holes 214 and 224 are arranged as an array, although other patterns may be used, depending on the pattern of the DUT.

Figure 3:
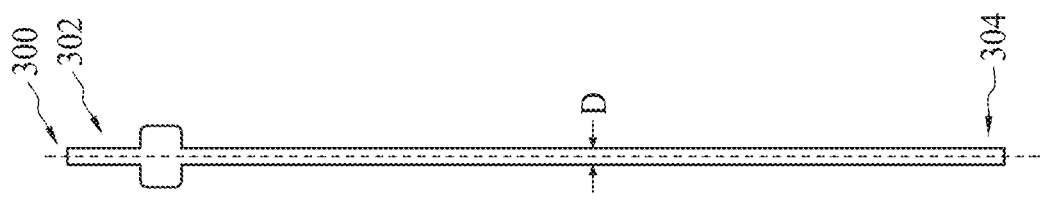
FIG. 3 is a schematic drawing illustrating a probe pin according to aspects of the present disclosure in one or more embodiments.

Referring to FIGS. 2 and 3, in some embodiments, the probe pin 300 is formed of conductive materials such as metals. In some embodiments, the probe pin 300 may have a circular cross-section. In other embodiments, the probe pin 300 may have a rectangular (such as a square) cross-section (a top view or a bottom view), but the disclosure is not limited thereto.

In some embodiments, the probe pin 300 includes a pin stopper (also referred to as a pin fin, not shown). In some embodiments, a width W of the pin stopper is greater than a diameter D of the probe pin 300. Further, a sum of the width W of the pin stopper and the diameter D of the probe pin 300 is greater than the widths of the through holes 214 of the upper die 210. The pin stopper may be coated on the probe pin 300, and may be formed of a conductive or a dielectric material. In some embodiments, an entirety of the probe pin 300 has a uniform diameter D. In some alternative embodiments, different portions of the probe pin 300 may have different diameters, though not shown.

Referring to FIGS. 2 and 3, in some embodiments, the probe pin 300 has two ends, wherein one end may be referred to as a pin head 302, and the opposite end may be referred to as a pin tip 304. When assembling the probe pin 300 into the probe head 200, the probe pin 300 is inserted into the probe head 200 such that the pin head 302 is exposed through the upper die 210, while the pin tip 304 is exposed through the lower die 220. The pin stopper may be disposed within the cavity C. As mentioned above, because the sum of the width W of the pin stopper and the diameter D of the probe pin 300 is greater than the width of the through holes 214 of the upper die 210, the pin stopper helps prevent the probe pin 300 from accidentally falling out of the probe head 200 through the through holes 214 of the upper die 210. Further, the pin head 302 and the pin tip 304 are aligned with each other; thus, a straight line may be formed as depicted by the dotted line in FIG. 3.

In some embodiments, when the probe pin 300 is in contact with a probe pad of a DUT (both not shown), the probe pin 300 may be pushed back by the contact pads, and deformation may occur. To control the deformation of the probe pin 300, the upper die 210 may be shifted laterally to bend the probe pin 300. As shown in FIGS. 4A and 4B, directions of the lateral shift are indicated by an arrow D1. The bending of the probe pin 300 may help prevent the probe pin 300 from shorting with each other. Consequently, positioned of the pin head 302 and the pin tip 304 are offset from each other, and a bending delta Δ may be formed, as shown in FIGS. 4A and 4B.

When the probe card or the probe head 200 reaches its service life end the probe head 200 is scrapped. However, the probe pin 300 may be re-used. In some embodiments, the bending of the probe pin 300 may cause difficulty in retrieval the probe pin 300.

Please refer to FIG. 1, which is a flowchart representing a method for a probe head pin retrieval 10 according to aspects of the present disclosure. The method 10 includes a number of operations (11, 12, 13, 14 and 15). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may be only briefly described herein. Thus, other implementations are possible within the scope of the various aspects described herein.

Figure 5:
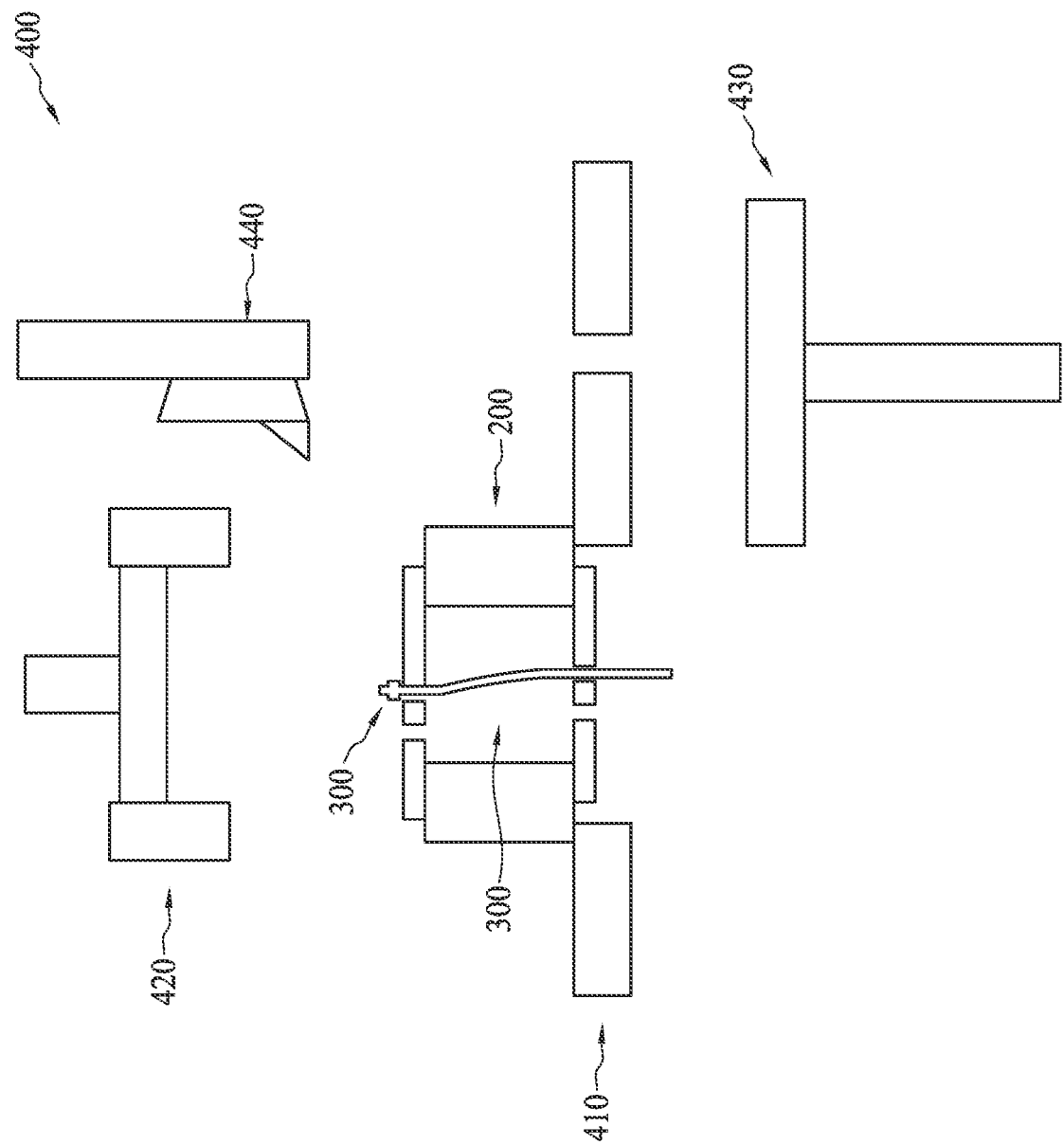

FIGS. 5 to 11, which are schematic drawings illustrating a method for a probe pin retrieval at various stages according to aspects of the present disclosure in one or more embodiments. In some embodiments, a system for retrieving a probe pin 400 is provided. As shown in FIG. 5, the system 400 includes a carrier 410, a bending fixture 420, a plate 430 and an arm 440. The carrier 410 is configured to accommodate a probe head of a probe card. For example, the carrier 410 can accommodate a probe head 200 as mentioned above. The bending fixture 420 is disposed over the carrier 410 and configured to clamp the upper die 210 of the probe head 200. Further, the bending fixture 420 moves in a horizontal direction. The plate 430 is disposed under the carrier 410 and configured to push the probe pin 300 of the probe head 200. The arm 440 is disposed over the carrier 410 and configured to pick the probe pin 300 out of the probe head 200.

Referring to FIG. 5, in some embodiments, in operation 11, the probe head 200 is received in the carrier 410. As mentioned above, the probe head 200 includes the upper die 210, the lower die 220, the spacer 230, and at least the probe pin 300. Further, the probe pin 300 extends in a direction from the lower die 220 to the upper die 210. In some embodiments, the carrier 410 may include a hollow configuration, such that the spacer 230 is disposed on and in contact with the carrier 410, leaving the lower die 220 exposed. In some embodiments, the carrier 410 may further include a securing element to clamp or secure the probe head 200, though not shown.

In some embodiments, in operation 12, a bending delta Δ is measured. As mentioned above, the bending delta Δ is measured as a lateral distance between the pin head 302 and the pin tip 304 of the probe pin 300. In some embodiments, a charge coupled device (CCD) may be used to detect and measure the bending delta Δ between the pin head 302 and the pin tip 304. In some embodiments, when the bending delta Δ is less than a value, it is determined that the retrieval of the probe pin 300 may be performed. In some alternative embodiments, when the bending delta Δ is greater than a value, it is determined that a deformation correction of the probe pin 300 may be required. In some embodiment, the system 400 may include a controller (not shown), and the determination of the retrieval or the deformation correction of the probe pin 300 may be performed by the controller. In other words, the retrieval or the deformation correction of the probe pin 300 may be performed automatically. In some embodiments, the controller can be a central processing unit (CPU), but the disclosure is not limited thereto.

Additionally, in some embodiments, the operation 12 may be performed prior to the operation 11.

Figure 6:
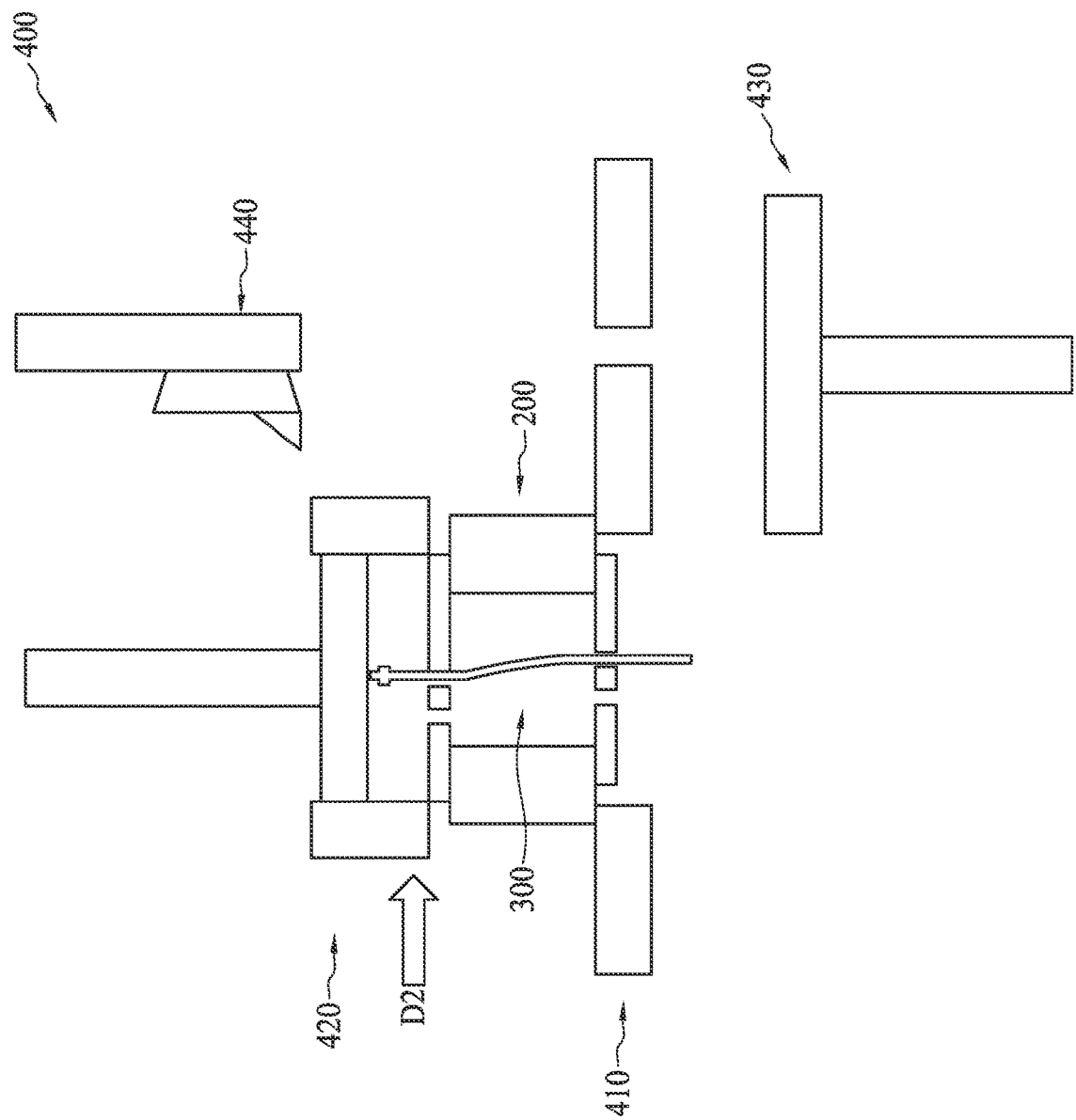

Referring to FIG. 6, in some embodiments, in operation 13, the probe pin 300 is bent by the bending fixture 420 when the bending delta Δ is greater than the value. In some embodiments, the value may be approximately 120 micrometers. That is, when the bending delta Δ is greater than approximately 120 micrometers, a deformation correction is required. However, those skilled in the art can realize that the value may be smaller than 120 micrometers as pitches of probe pads are continuously reduced. As shown in FIG. 6, in some embodiments, the bending fixture 420 may be lowered to clamp the upper die 210. Subsequently, the bending fixture 420 moves in a direction D2 parallel to a surface of the upper die 210. In some embodiments, the bending fixture 420 moves in the direction D2 which is parallel to the bending direction D1. Further, the bending fixture 420 moves in the direction D2 opposite to the bending direction D1. Because the upper die 210 is clamped by the bending fixture 420, the upper die 210 is moved along with the bending fixture 420, while the lower die 220 and the spacer 230 are secured on the carrier 410.

Figure 7:
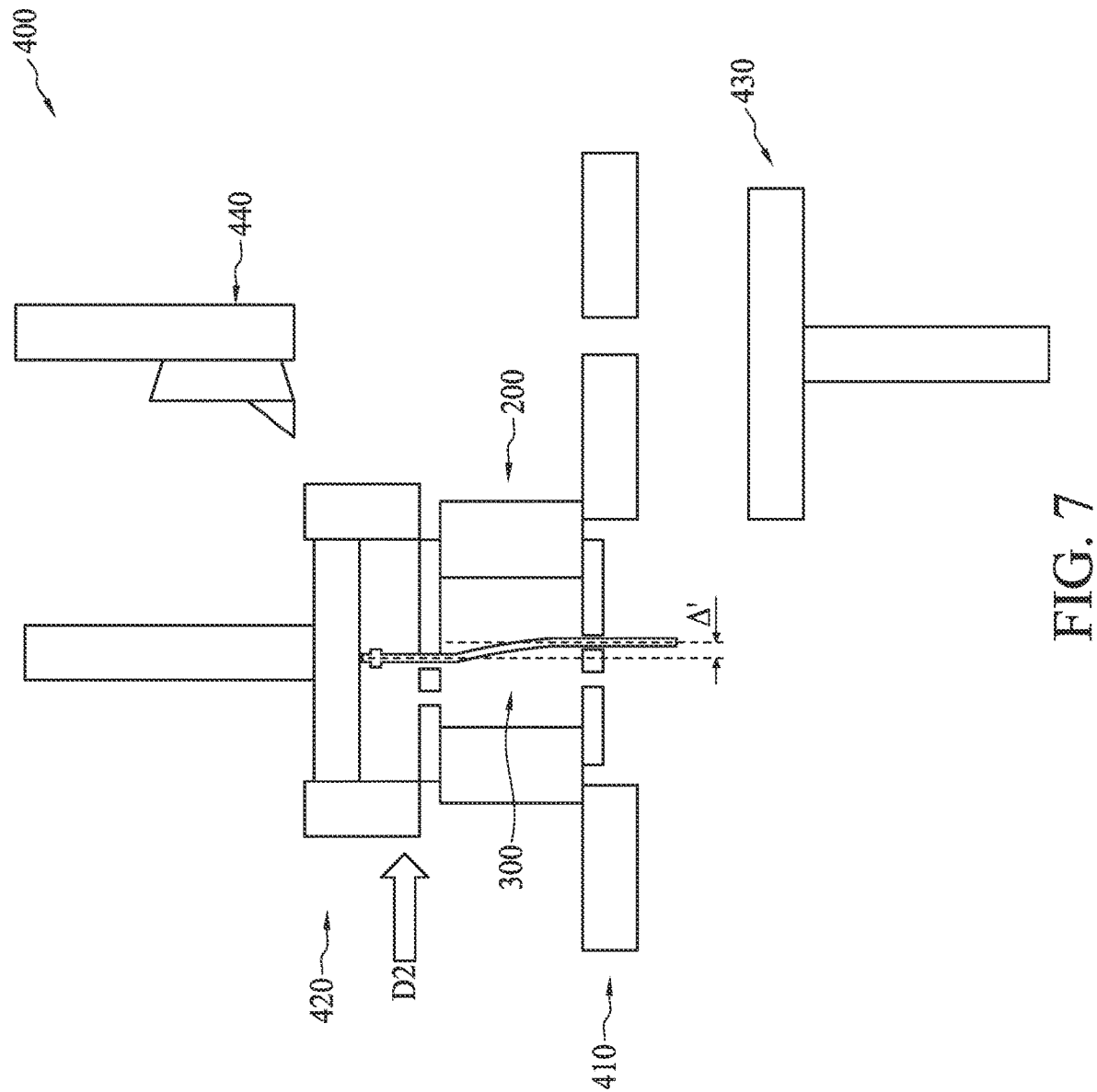

Referring to FIG. 7, in some embodiments, the bending fixture 420 bends the probe pin 300 during the moving of the upper die 210. Another bending delta Δ' may be obtained after the bending of the probe pin 300. As mentioned above, the bending delta Δ is defined as a lateral distance between the pin head 304 and the pin tip 306. In some embodiments, the moving of the bending fixture 420 moves the upper die 210 and bends the probe pin 300 such that the deformation of the probe pin 300 may be mitigated. For example, the bending delta Δ' of the probe pin 300 after the moving of the bending fixture 420 (and the bending of the probe pin 300) is less than the bending delta Δ before the moving of the bending fixture 420 (and the bending of the probe pin 300). Accordingly, the bending delta Δ' is less than the value. For example, the bending delta Δ' is less than 120 micrometers, but the disclosure is not limited thereto.

Figure 8:
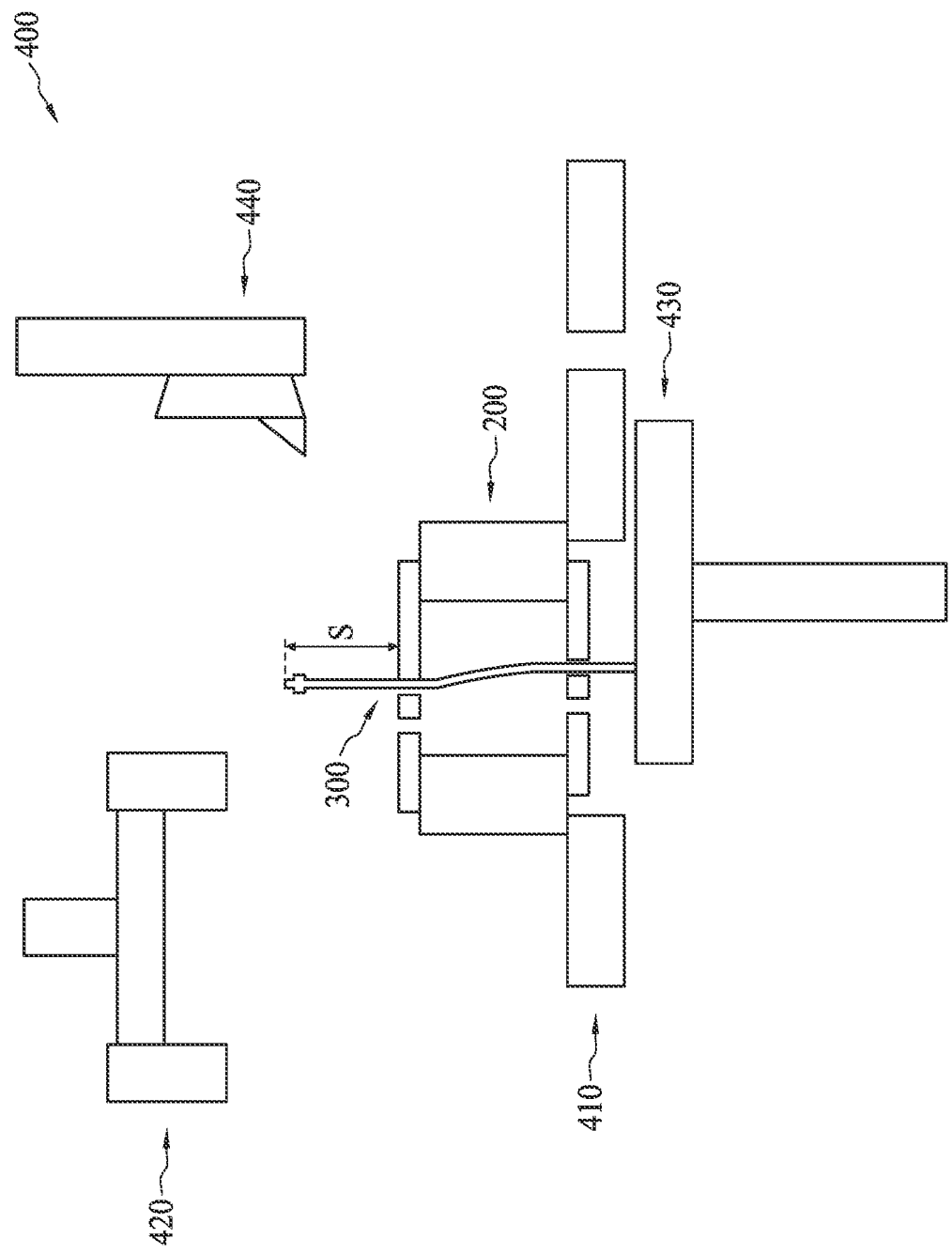

Referring to FIG. 8, in operation 14, the probe pin 300 is pushed in a direction from the lower die 220 toward the upper die 210 by the plate 430. In some embodiments, the bending fixture 420 is moved away from the probe head 200, as shown in FIG. 8. Subsequently, the plate 430 is moved toward the lower die 220. The plate 430 is raised to in contact with pin tip 306 of the probe pin 300. Further, the plate 430 pushes the probe 300 in the direction from the lower die 220 toward the upper die 210. Consequently, the probe pin 300 is raised. In some embodiments, a force of the plate 430 is sufficient to push the pin stopper out of the upper die 210, as shown in FIG. 8. As mentioned above, the width of the through hole 214 of the upper die 210 is less than the sum of the diameter of the probe pin 300 and the width of the pin stopper. Therefore, the force of the plate 430 must be great enough to push the pin stopper above a surface of the upper die 210. In other words, the pin stopper is raised to be higher than the surface of the upper die 210.

In some embodiments, a distance S may be defined between the pin head 302 and the surface of the upper die 210 after the pushing of the probe pin 300. In some embodiments, the distance S is defined between a top surface of the pin head 302 and the surface of the upper die 210. In some embodiments, the distance S may be greater than approximately 200 micrometers, but the disclosure is not limited thereto. In some embodiments, the distance S is made greater than 200 micrometers for a subsequent operation. However, the distance S may be greater than or less than 200 micrometers, according to different system requirements.

Figure 9:
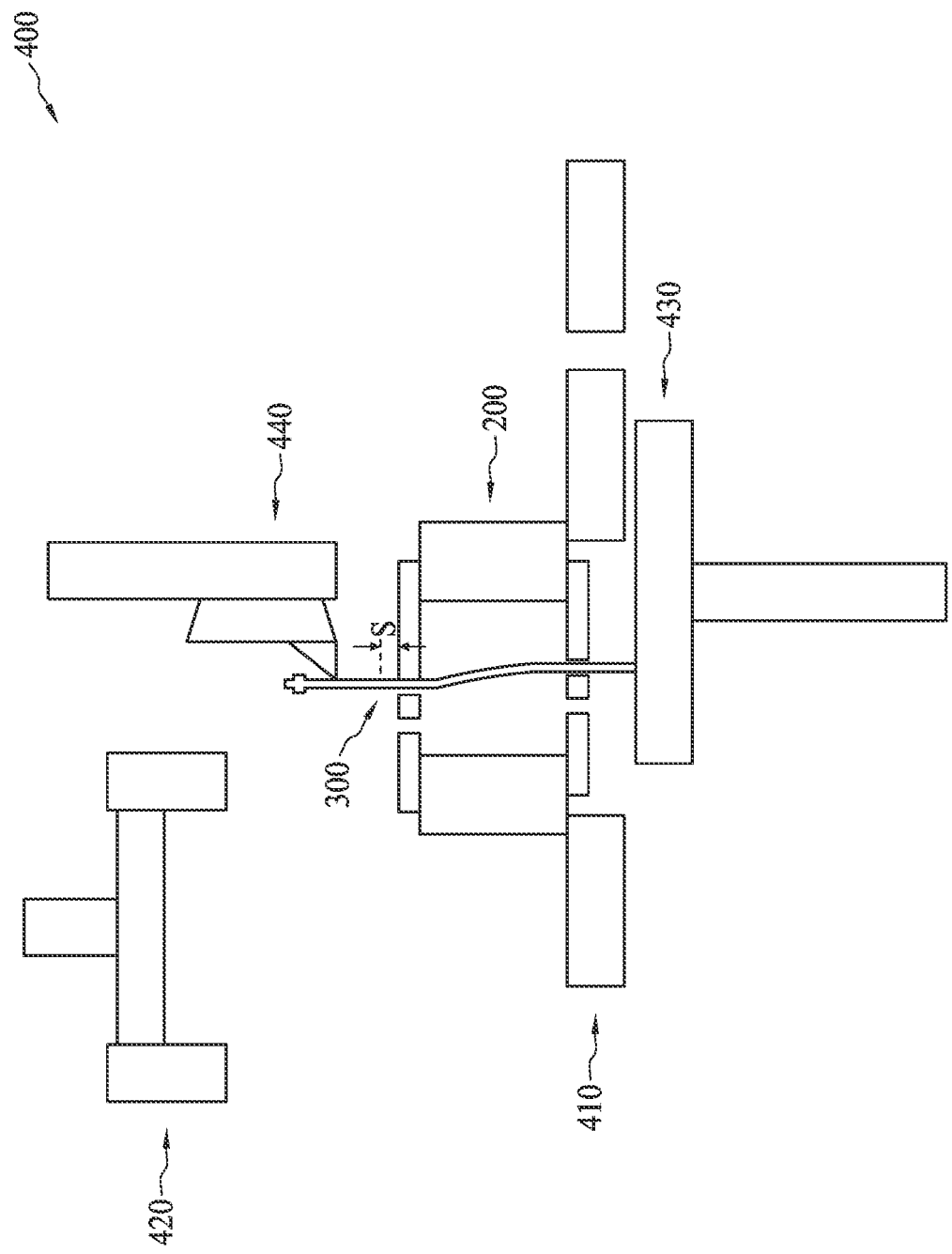
Figure 10:
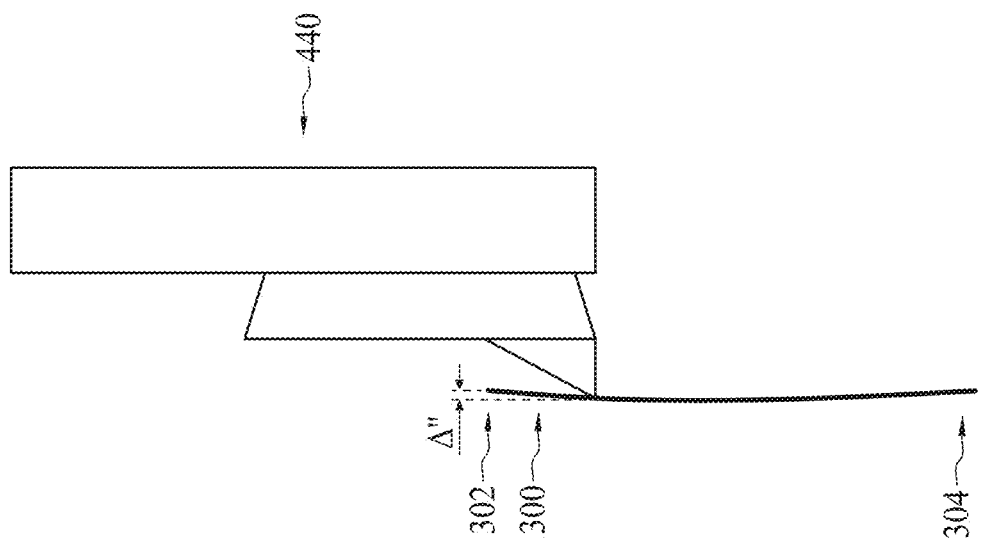

Referring to FIG. 9, in operation 15, the probe pin 300 is picked from the probe head 200 by the arm 440. As mentioned above, because the bending delta Δ' is less than the value, it is easier to pick the probe pin 300. Thus, the difficulty of the retrieval of the probe pin 300 is mitigated.

Additionally, in some embodiments, when the bending delta Δ of the probe pin 300 is less than the above-mentioned value, the operation 13 may be omitted, and the operation is performed to push the probe pin 300 by the plate 430. Because the bending delta Δ is less than the above-mentioned value, the probe pin 300 may be easily pushed to obtain the distance S between the pin head 304 and the surface of the upper die 210. The operation 15 may be performed to pick the probe pin 300 out of the probe head 200 using the arm 440.

In some embodiments, the probe pin 300 may be inspected after the retrieval from the probe head 200. Accordingly, a good probe pin 300 may be determined to be re-usable.

In some embodiments, the probe pin 300 is put in a pin box by the arm 440. The probe pin 300 may be stored and protected in the pin box.

In some embodiments, the probe pin 300 may be re-used in a new probe head. In such embodiments, the arm 440 may move to clamp and pick the probe pin 300. In some embodiments, operations for the deformation correction may be performed. In some embodiments, operations for straightening the probe pin 300 may be performed. Consequently, a bending delta Δ" of the probe pin 300 may obtained. In some embodiments, the bending delta Δ" of the probe pin 300 is less than the value. For example, the bending delta Δ" of the probe pin 300 may be less than approximately 120 micrometers, but the disclosure is not limited thereto. In some embodiments, the bending delta Δ" of the probe pin 300 is equal to or less than the bending delta Δ' and the bending delta Δ. In some embodiments, CCD may be used to measure the bending delta Δ".

Figure 11:
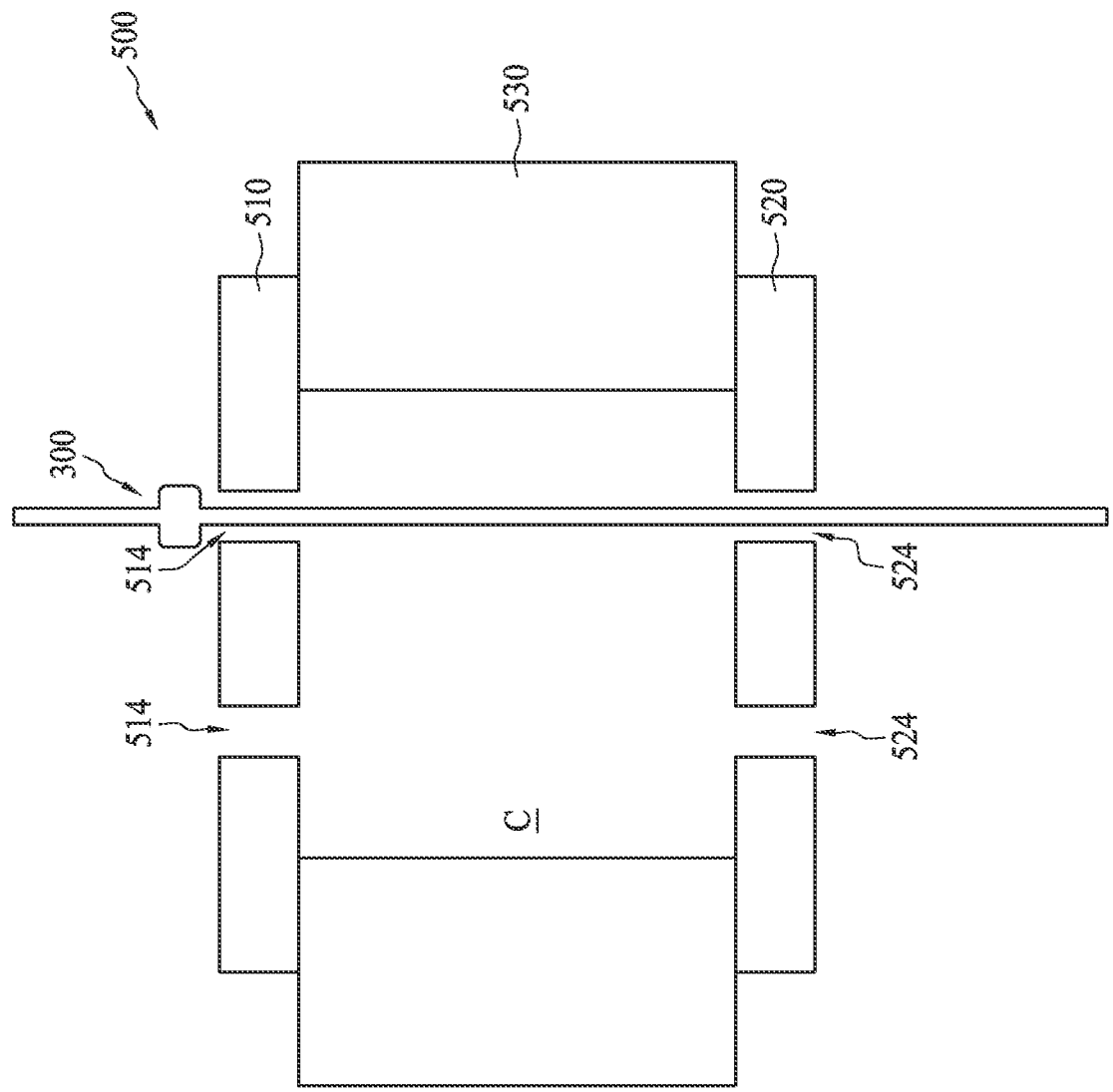

Referring to FIG. 11, in some embodiments, a new probe head 500 may be received. The probe head 500 may include upper die 510, lower die 520, and a spacer 530 between the upper and lower dies 510- and 520, but the disclosure is not limited thereto. The upper die 510 may have a plurality of through holes 514. Parameters of the through holes 514 may be similar to those described above; therefore, repeated description is omitted for brevity. The lower die 520 may have a plurality of through holes 524. Parameters of the through holes 524 may be similar to those described above; therefore, repeated description is omitted for brevity. As mentioned above, the through hole 514 of the upper die 510 and the through hole 524 of the lower die 520 are vertically aligned with a one-to-one correspondence.

In some embodiments, the arm 440 moves the probe pin 300 and assembles the probe pin 300 into the probe head 500, as shown in FIG. 11. Because the bending delta Δ" of the probe pin 300 is equal to or less than the bending delta Δ', the probe pin 300 can be easily inserted into the probe head 500. Thus, re-use rate of the probe pin 300 may be increased.

Figure 12:
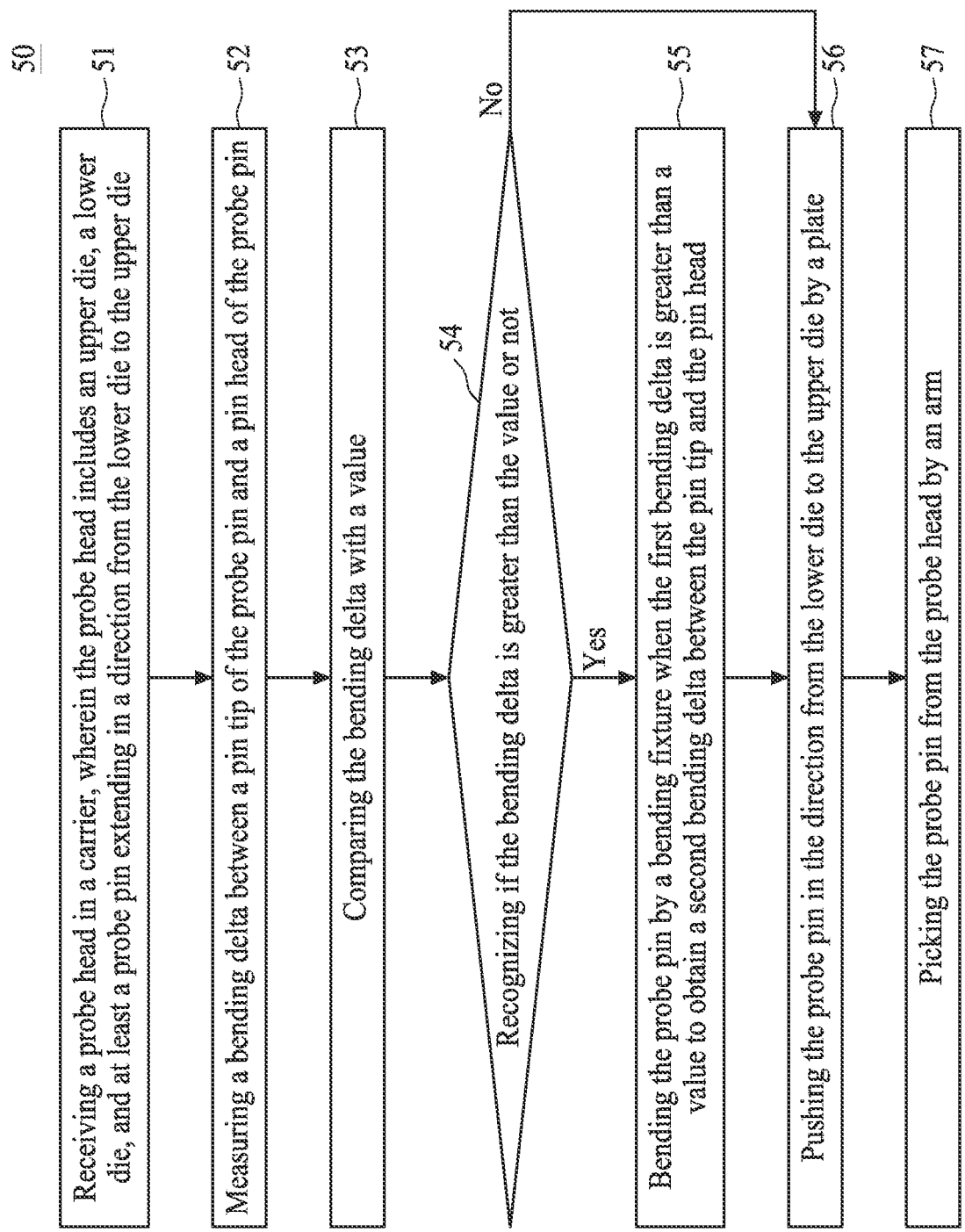
FIG. 12 shows a flowchart representing a method for a probe pin retrieval according to aspects of the present disclosure in one or more embodiments.

FIG. 12 is a flowchart representing a method for retrieving a probe pin 50 according to aspects of the present disclosure. The method 50 includes a number of operations (51, 52, 53, 54, 55, 56 and 57). The method 50 will be further described according to one or more embodiments. It should be noted that the operations of the method 50 may be rearranged or otherwise modified within the scope of the various aspects. It should be further noted that additional processes may be provided before, during, and after the method 50, and that some other processes may be only briefly described herein. Thus, other implementations are possible within the scope of the various aspects described herein.

In some embodiments, in operation 51, a probe head 200 is received. As mentioned above, the probe head 200 includes one or more upper die 210, one or more lower die 220, a spacer 230 between the upper and lower dies 210 and 220, and at least a probe pin 300. As mentioned above, the upper die 210, the lower die 220, and the spacer 230 together form a cavity C. The probe pin 300 passes through the lower die 220, the cavity C and the upper die 210 through holes 214 and 224. In some embodiments, the probe pin 300 extends in a direction from the lower die 220 toward the upper die 210. Further, a pin head 302 of the probe pin 300 protrudes from an outer surface of the upper die 210, while a pin tip 304 of the probe pin 300 protrudes from an outer surface of the lower die 220. In some embodiments, the probe pin 300 may include a pin stopper for preventing the probe pin 300 from accidentally falling out of the probe head 200 through the upper die 210.

In some embodiments, when the probe pin 300 is in contact with a probe pad of a DUT (both not shown), the probe pin 300 may be pushed back by the contact pads, and deformation may occur. To control the deformation of the probe pin 300, the upper die 210 may be shifted laterally to bend the probe pin 300. As shown in FIGS. 4A and 4B, the lateral shift directions are indicated by an arrow D1. The bending of the probe pins 300 may help prevent the probe pins 300 from shorting with each other. Consequently, positions of the pin head 304 and the pin tip 306 are offset, and a bending delta Δ may be formed between the pin head 304 of the probe pin 300 and the pin tip 306 of the probe pin 300, as shown in FIGS. 4A and 4B. As mentioned above, the bending delta Δ is measured as a lateral distance between the pin head 304 and the pin tip 306 of the probe pin 300.

In operation 52, the bending delta Δ of the probe pin 300 is measured. As mentioned above, a CCD may be used to measure the bending delta Δ of the probe pin 300. In operation 53, the bending delta Δ is compared to a value. In some embodiments, the value may be approximately 120 micrometers. That is, when the bending delta Δ is greater than approximately 120 micrometers, a deformation correction is required. However, those skilled in the art can realize that the value may be smaller than 120 micrometers as pitches of probe pads are continuously reduced.

In operation 54, it is determined whether the bending delta Δ is greater than the value. In some embodiments, when the bending delta Δ is greater than the value, a positive result is determined, and operation 55 is performed. In some embodiments, the recognizing and the determination may be performed by a controller, as mentioned above.

Referring to FIG. 7, in some embodiments, the bending fixture 420 is used to clamp the upper die 210. The bending fixture 420 moves in a direction D2 parallel to a surface of the upper die 210. In some embodiments, the bending fixture 420 moves in the direction D2, which is parallel to the bending direction D1. Further, the bending fixture 420 moves in the direction D2 opposite to the bending direction D1. Because the upper die 210 is clamped by the bending fixture 420, the upper die 210 is moved along with the bending fixture 420, while the lower die 220 and the spacer 230 are secured on the carrier 410. In some embodiments, the moving of the bending fixture 420 moves the upper die 210 and bends the probe pin 300 such that the deformation of the probe pin 300 may be mitigated.

Referring to FIG. 8, in operation 56, the probe pin 300 is pushed in a direction from the lower die 220 toward the upper die 210 by the plate 430. In some embodiments, the bending fixture 420 is moved away from the probe head 200, as shown in FIG. 8. Subsequently, the plate 430 is moved toward to the lower die 220. The plate 430 is raised to contact the pin tip 304 of the probe pin 300. Further, the plate 430 pushes the probe pin 300 in the direction from the lower dies 220 toward the upper die 210. Consequently, the probe pin 300 is raised, as shown in FIG. 8. In some embodiments, a force of the plate 430 is sufficient to push the pin stopper out of the upper die 210. As mentioned above, the width of the through hole 214 of the upper die 210 is less than the sum of the diameter of the probe pin 300 and the width of the pin stopper. Therefore, the force of the plate 430 must be great enough to push the pin stopper above the surface of the upper die 210. In other words, the pin stopper is raised to be higher than the surface of the upper die 210.

As mentioned above, a distance S may be defined between the pin head 302 and the surface of the upper die 210 after the pushing of the probe pin 300. In some embodiments, the distance S is defined between a top surface of the pin head 302 and the surface of the upper die 210. In some embodiments, the distance S may be greater than approximately 200 micrometers, but the disclosure is not limited thereto. In some embodiments, the distance S is made greater than 200 micrometers for a subsequent operation. However, the distance S may be greater than or less than 200 micrometers, according to different system requirements.

In some embodiments, in operation 57, the probe pin 300 is picked from the probe head 200 by an arm 440. As mentioned above, because the bending delta Δ' is less than the value, it is easier to pick the probe pin 300. Thus, the difficulty of the retrieval of the probe pin 300 is mitigated.

Alternatively, in some embodiments, when the bending delta Δ is less than the value, a negative result is determined in operation 54. In such embodiments, operation 55 is not performed, and operations 56 and 57 are performed.

According to one embodiment of the present disclosure, a method for retrieving a probe pin are provided. The method uses a bending fixture of the system to move an upper die of a probe head, thereby bending the probe pin. Consequently, a bending delta of the probe pin is reduced such that the probe pin can be easily retrieved from the probe head. The retrieved probe pin may be stored in a pin box, and may be further treated to mitigate a deformation issue. Such probe pin may be re-used in a new probe head. Accordingly, a re-use rate of the probe pin is improved.

According to one embodiment of the present disclosure, a method for retrieving a probe pin is provided. The method includes following operations. A probe head is received in a carrier. The probe head includes an upper die, a lower die, and at least a probe pin extending in a direction from the lower die to the upper die. A first bending delta between a pin tip of the probe pin and a pin head of the probe pin is measured. The probe pin is bent by a bending fixture when the first bending delta is greater than a value to obtain a second bending delta between the pin tip and the pin head. The probe pin is pushed in the direction from the lower die to the upper die by a plate. The probe pin is picked from the probe head by an arm.

According to one embodiment of the present disclosure, a method for retrieving a probe pin is provided. The method includes following operations. A probe head is received in a carrier. The probe head includes an upper die, a lower die, and at least a probe pin extending in a direction from the lower die to the upper die. A bending fixture is used to clamp the upper die and the move the upper die so as to bend the probe pin in a direction parallel to a surface of the upper die. The probe pin has a first bending delta prior to the moving of the upper die and a second bending delta after the moving of the upper die. The second bending delta is less than the first bending delta.

According to one embodiment of the present disclosure, a method for retrieving a probe pin is provided. The method includes following operations. A probe head is received in a carrier. The probe head includes an upper die, a lower die, and at least a probe pin extending in a direction from the lower die to the upper die. A first bending delta between a pin tip of the probe pin and a pin head of the probe pin is measured using a charge-coupled device. A deformation correction is performed when the first bending delta is greater than a value. The deformation correction further includes using a bending fixture to clamp the upper die of the probe head, and moving the bending fixture to bend the probe pin to obtain a second bending delta between the pin tip and the pin head. The probe pin is pushed in the direction from the lower die to the upper die by a plate after the performing of the deformation correction or when the first bending delta is less than the value. The probe pin is picked from the probe head by an arm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for retrieving a probe pin, comprising:
   receiving a probe head in a carrier, wherein the probe head comprises an upper die, a lower die, and at least a probe pin extending in a direction from the lower die to the upper die;
   measuring a first bending delta between a pin tip of the probe pin and a pin head of the probe pin;

bending the probe pin by a bending fixture when the first bending delta is greater than a value to obtain a second bending delta between the pin tip and the pin head;

pushing the probe pin in the direction from the lower die to the upper die by a plate;

picking the probe pin from the probe head by an arm;

retrieving the probe pin and putting the probe pin into a pin box by the arm;

picking the probe pin from the pin box by the arm; and assembling the probe pin into another probe head by the arm, wherein a third bending delta between the pin tip of the probe pin and the pin head of the probe pin is equal to or less than the second bending delta.

2. The method of claim 1, wherein the second bending delta is less than the value.

3. The method of claim 1, wherein the value is approximately 120 micrometers.

4. The method of claim 1, wherein a distance between the pin head of the probe pin and a surface of the upper die is greater than 200 micrometers after the pushing of the probe pin.

5. The method of claim 1, wherein the measuring of the first bending delta is performed by a charge-coupled device (CCD).

6. The method of claim 1, further comprising pushing the probe pin in the direction from the lower die to the upper die by the plate without the bending of the probe pin when the first bending delta is less than the value.

7. The method of claim 1, further comprising straightening the probe pin prior to the assembling of the probe pin into another probe head by the arm.

8. The method of claim 7, wherein the straightening of the probe pin obtains the third bending data.

9. The method of claim 8, wherein the third bending data is less than the value.

10. A method for retrieving a probe pin, comprising:

receiving a probe head, wherein the probe head comprises an upper die, a lower die, and at least a probe pin extending in a direction from the lower die to the upper die;

using a bending fixture to clamp the upper die and move the upper die so as to bend the probe pin in a direction parallel to a surface of the upper die;

retrieving the probe pin and putting the probe pin into a pin box by an arm;

picking the probe pin from the pin box by the arm; and assembling the probe pin into another probe head by the arm, wherein the probe pin has a first bending delta prior to the moving of the upper die, and a second bending delta after the moving of the upper die, and the second bending delta is less than the first bending delta, wherein a third bending delta of the probe pin picked from the pin box prior to the assembling is equal to or less than the second bending delta.

11. The method of claim 10, wherein the first bending delta is greater than approximately 120 micrometers.

12. The method of claim 10, wherein the second bending delta is less than approximately 120 micrometers.

13. The method of claim 10, wherein the upper die comprises a through hole allowing the probe pin through.

14. The method of claim 10, further comprising:

using a plate to push the probe pin in the direction from the lower die to the upper die; and using the arm to retrieve the probe pin from the probe head.

15. The method of claim 14, wherein a distance between a pin head of the probe pin and the surface of the upper die is greater than approximately 200 micrometers.

16. The method of claim 10, further comprising using a charge-coupled device (CCD) to measure the first bending delta and the second bending delta.

17. A method for retrieving a probe pin, comprising:

receiving a probe head in a carrier, wherein the probe head comprises an upper die, a lower die, and at least a probe pin extending in a direction from the lower die to the upper die;

using a charge-coupled device to measure a first bending delta between a pin tip of the probe pin and a pin head of the probe pin;

performing a deformation correction when the first bending delta is greater than a value, wherein the deformation correction comprises:

using a bending fixture to clamp the upper die of the probe head; and moving the bending fixture to bend the probe pin to obtain a second bending delta between the pin tip and the pin head;

pushing the probe pin in the direction from the lower die to the upper die by a plate after the performing of the deformation correction or when the first bending delta is less than the value;

picking the probe pin from the probe head by an arm;

retrieving the probe pin and putting the probe pin into a pin box by the arm;

picking the probe pin from the pin box by the arm; and assembling the probe pin into another probe head by the arm, wherein a third bending delta between the pin tip of the probe pin and the pin head of the probe pin is equal to or less than the second bending delta.

18. The method of claim 17, wherein the second bending delta is less than the value.

19. The method of claim 17, wherein a distance between the pin head of the probe pin and a surface of the upper die is greater than 200 micrometers after the pushing of the probe pin.

20. The method of claim 17, wherein the value is approximately 120 micrometers.

* * * * *